United States Patent
Hung et al.

(10) Patent No.: US 9,613,969 B2
(45) Date of Patent: Apr. 4, 2017

(54) SEMICONDUCTOR STRUCTURE AND METHOD OF FORMING THE SAME

(71) Applicant: UNITED MICROELECTRONICS CORP., Hsin-Chu (TW)

(72) Inventors: Ching-Wen Hung, Tainan (TW); Wei-Cyuan Lo, Taichung (TW); Ming-Jui Chen, Hsinchu (TW); Chia-Lin Lu, Taoyuan (TW); Jia-Rong Wu, Kaohsiung (TW); Yi-Hui Lee, Taipei (TW); Ying-Cheng Liu, Tainan (TW); Yi-Kuan Wu, Kaohsiung (TW); Chih-Sen Huang, Tainan (TW); Yi-Wei Chen, Taichung (TW); Tan-Ya Yin, Nantou County (TW); Chia-Wei Huang, Kaohsiung (TW); Shu-Ru Wang, Taichung (TW); Yung-Feng Cheng, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/793,714

(22) Filed: Jul. 7, 2015

(65) Prior Publication Data
US 2016/0351575 A1 Dec. 1, 2016

(30) Foreign Application Priority Data

May 27, 2015 (TW) .............................. 104116909 A

(51) Int. Cl.
*H01L 27/11* (2006.01)
*H01L 29/76* (2006.01)
(Continued)

(52) U.S. Cl.
CPC .... *H01L 27/1108* (2013.01); *H01L 21/31144* (2013.01); *H01L 21/76802* (2013.01);
(Continued)

(58) Field of Classification Search
CPC ............. H01L 27/1108; H01L 29/7851; H01L 29/7853; H01L 23/535; H01L 21/31144;
(Continued)

(56) References Cited

U.S. PATENT DOCUMENTS

2004/0217418 A1* 11/2004 Imam .................. H01L 29/7813
257/341
2013/0258709 A1 10/2013 Thompson
(Continued)

*Primary Examiner* — Dao H Nguyen
(74) *Attorney, Agent, or Firm* — Winston Hsu; Scott Margo

(57) ABSTRACT

The present invention provides a semiconductor structure, including a substrate, a plurality of fin structures, a plurality of gate structures, a dielectric layer and a plurality of contact plugs. The substrate has a memory region. The fin structures are disposed on the substrate in the memory region, each of which stretches along a first direction. The gate structures are disposed on the fin structures, each of which stretches along a second direction. The dielectric layer is disposed on the gate structures and the fin structures. The contact plugs are disposed in the dielectric layer and electrically connected to a source/drain region in the fin structure. From a top view, the contact plug has a trapezoid shape or a pentagon shape. The present invention further provides a method for forming the same.

6 Claims, 11 Drawing Sheets

(51) Int. Cl.
*H01L 21/768* (2006.01)
*H01L 29/78* (2006.01)
*H01L 23/535* (2006.01)
*H01L 21/8234* (2006.01)
*H01L 21/311* (2006.01)

(52) U.S. Cl.
CPC ............... *H01L 21/76877* (2013.01); *H01L 21/823431* (2013.01); *H01L 21/823475* (2013.01); *H01L 23/535* (2013.01); *H01L 29/7851* (2013.01)

(58) Field of Classification Search
CPC ......... H01L 21/76802; H01L 21/76877; H01L 21/823431; H01L 21/823475
USPC ......... 257/288, 341, 368, 401; 438/283, 294
See application file for complete search history.

(56) References Cited

U.S. PATENT DOCUMENTS

2015/0325652 A1* 11/2015 Girdhar ................ H01L 27/088
257/401
2016/0093741 A1* 3/2016 Yang .................... H01L 29/045
257/288

* cited by examiner

SEMICONDUCTOR STRUCTURE AND METHOD OF FORMING THE SAME

BACKGROUND OF THE INVENTION

1. Field of the Invention

The present invention is related to a semiconductor structure and a method of forming of the same, and more particularly, to a semiconductor structure having contact plugs and a method of forming the same.

2. Description of the Prior Art

In recent years, as various kinds of consumer electronic products have been constantly developed towards miniaturization and the size of semiconductor components has reduced accordingly, in order to meet requirements of high integration, high performance, low power consumption, and demands for the products.

However, with the miniaturization development of the electronic products, current planar transistors no longer meet the requirements of the products. Non-planar transistors, such as fin field effect transistors (Fin-FET), have been therefore to obtain a high drive current and to lessen short channel effect. However, due to the three-dimensional structure of the Fin-FET, a lot of drawbacks raises as well. For example, in conventional Fin-FET, the fin structure includes a corner with a nearly 90 degrees, which may result in uneven voltage distribution through the channel. Consequently, the quality of the Fin-FET is affected.

Therefore, there is still a need for a novel FET structure and a method of making the same.

SUMMARY OF THE INVENTION

For achieving a device with better electrical performance, the present invention therefore provides a semiconductor structure that is easy to fabricate.

According to one embodiment, a semiconductor structure is provided, including a substrate, a plurality of fin structures, a plurality of gate structures, a dielectric layer and a plurality of contact plugs. The substrate has a memory region. The fin structures are disposed on the substrate in the memory region, each of which stretches along a first direction. The gate structures are disposed on the fin structures, each of which stretches along a second direction. The dielectric layer is disposed on the gate structures and the fin structures. The contact plugs are disposed in the dielectric layer and electrically connected to a source/drain region in the fin structure. From a top view, the contact plug has a trapezoid shape or a pentagon shape.

According to another embodiment, a method of forming the above semiconductor structure is provided. First, a substrate having a memory region is provided. A plurality of fin structures in the memory region on the substrate are provided and each fin structure stretching along a first direction. A plurality of gate structures are formed on the fin structures, and each gate structure stretching along a second direction. Next, a dielectric layer is formed on the gate structures. A first patterned mask layer is formed on the dielectric layer, wherein the first patterned mask layer has a plurality of first trenches stretching along the second direction through the memory region from a top view. A second patterned mask layer on the first patterned mask layer, wherein the second patterned mask layer comprises a plurality of first patterns stretching along the first direction through the memory region from the top view. Subsequently, the dielectric layer is patterned by using the first patterned mask layer and the second patterned mask layer as a mask to form a plurality of contact vias. Then, the contact holes are filled with a conductive layer.

Since the first patterned mask layer and the second patterned mask layer have patterns that are easy to form, the yields of the product can be upgraded. According to different embodiments, novel shapes of the contact plugs can also be provided.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be detailed. The preferred embodiments of the present invention are illustrated in the accompanying drawings with numbered elements.

Please see FIG. 1A, FIG. 1B, FIG. 2A, FIG. 2B, FIG. 3A, FIG. 3B, FIG. 4A and FIG. 4B showing schematic diagrams of the method for forming the semiconductor device according to the one embodiment of the present invention, wherein FIG. 1A, FIG. 2A, FIG. 3A, FIG. 4A are top view, and FIG. 1B, FIG. 2B, FIG. 3B, FIG. 4B are cross-sectional view taken along line QQ' of FIG. 1A, FIG. 2A, FIG. 3A, FIG. 4A, FIG. 5A, respectively.

Figure 1A:
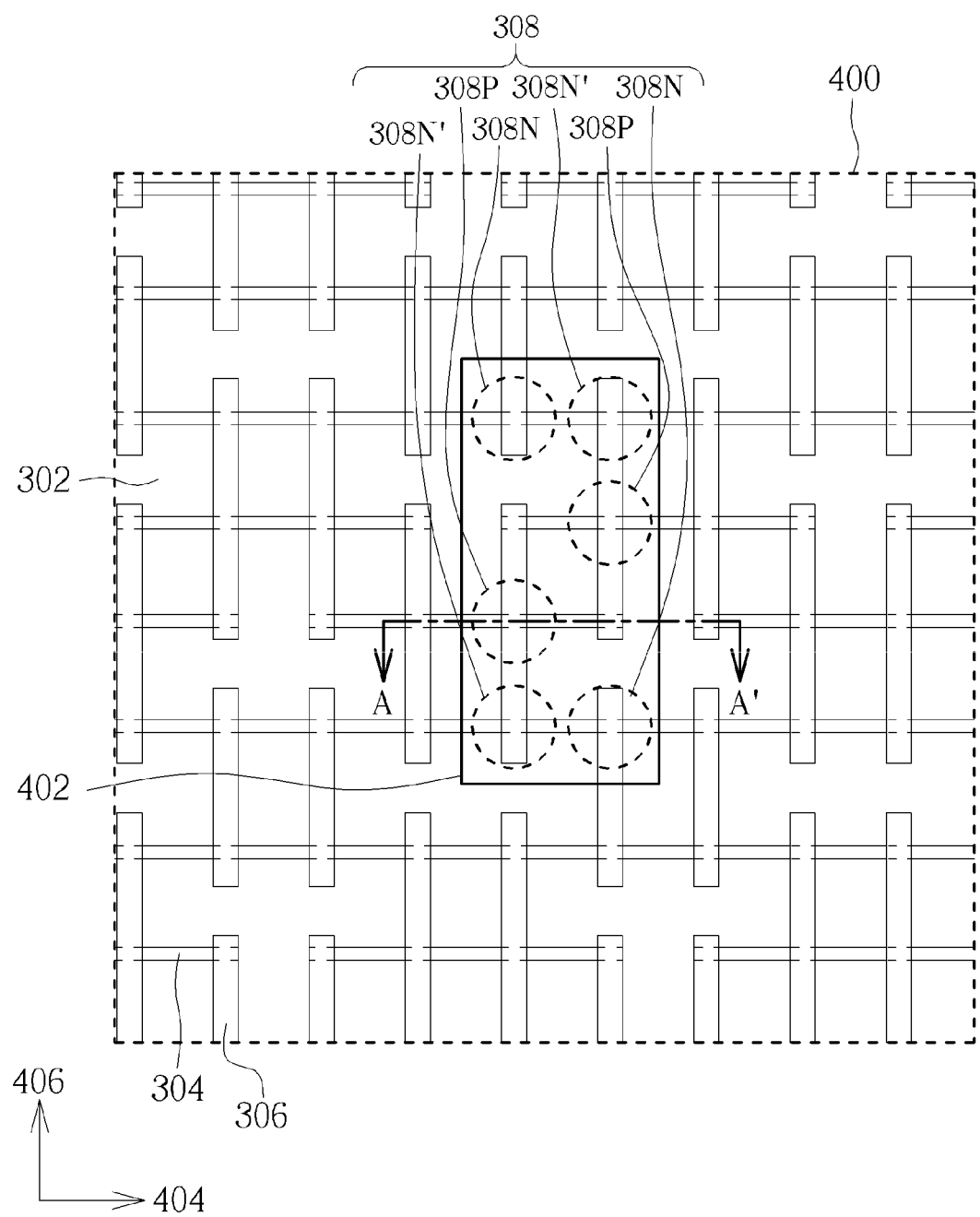
FIG. 1A, FIG. 1B, FIG. 2A, FIG. 2B, FIG. 3A, FIG. 3B, FIG. 4A and FIG. 4B are schematic diagrams of the method for forming the semiconductor device according to the one embodiment of the present invention.
Figure 1B:
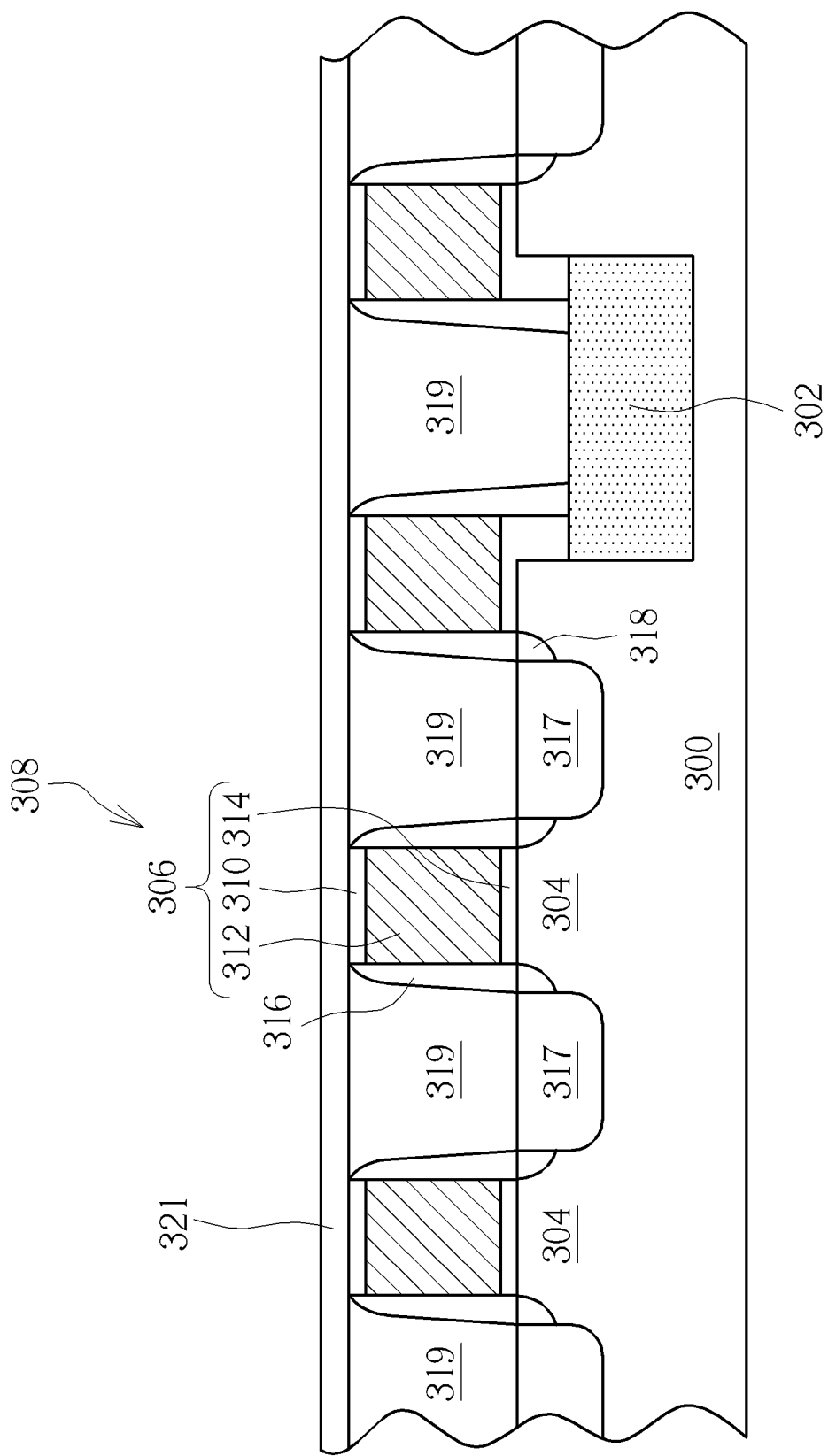
Figure 7:
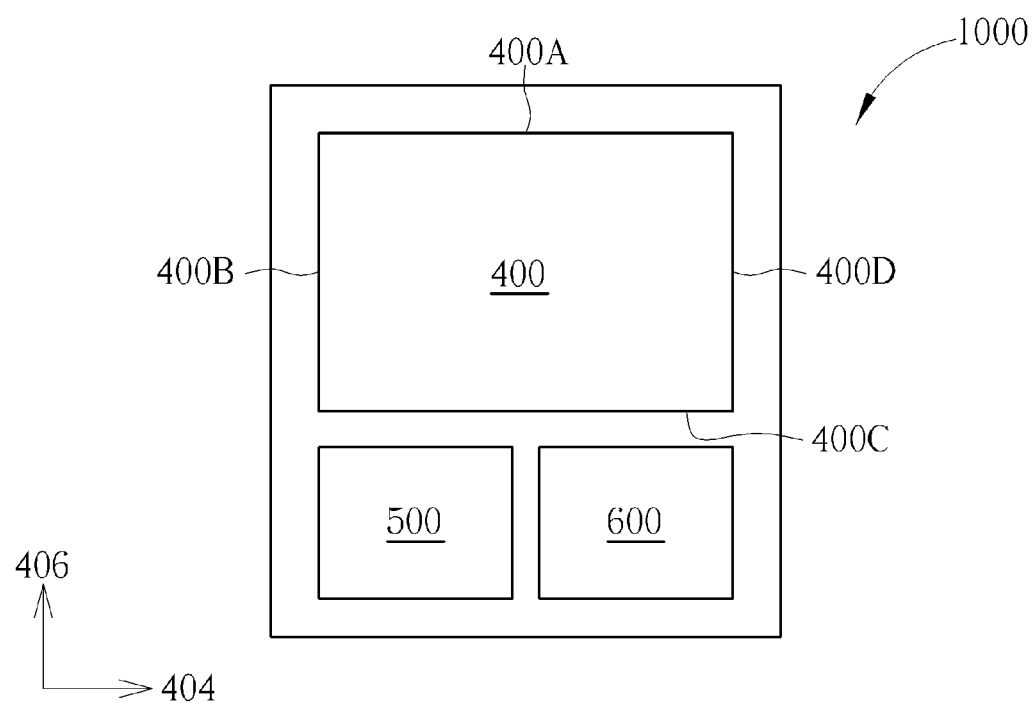
FIG. 7 shows a schematic diagram of the chip according to one embodiment of the present invention.
Figure 8:
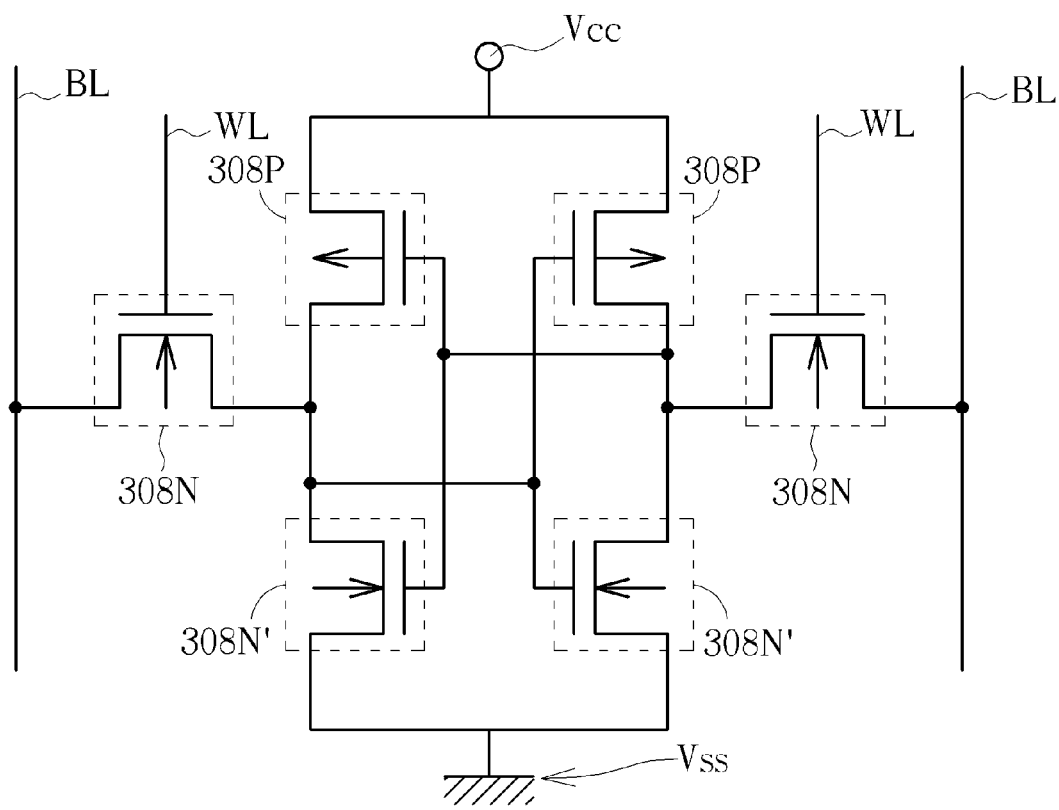
FIG. 8 shows a schematic diagram of the equivalent circuit of the 6 T memory cell.

Please see FIG. 1A and FIG. 1B first. A substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, is also suitable for the semiconductor substrate 300. In one embodiment, the substrate 300 has a memory cell region. Please refer to FIG. 7, showing a schematic diagram of the chip according to one embodiment of the present invention. As shown, a chip 1000 has a memory 400. In one embodiment, the memory region 400 is a static random access memory (SRAM) region. It is understood that the chip 1000 can further has a CPU region 800 and/or a FR region 900, but is not limited thereto. Please refer back to FIG. 1A and FIG. 1B. A plurality of fin structures 304, a plurality of shallow trench isolations (STI) 302 and a plurality of gate structures 306 are formed on the substrate 300 in the memory region 400. The fin structures 304 stretch along a first direction 404, being encompassed by the STIs 302 and protruding thereover. The method for forming the fin structure 304 includes, for example, forming a patterned hard mask layer (not shown) on the substrate 300, performing an etching process to form a plurality of trenches (not shown) in the substrate 300, filling an insulating material such as $SiO_2$ into the trenches, and performing a planarization and/or etching process to form said STIs 302. The protruding portion of the substrate 300 above STI 302 therefore becomes the fin structures 304. Next, the gate structure 306 is formed. The method for forming the gate structure 306, for example, forming a gate dielectric material layer (not shown), a gate material layer (not shown), a capping material layer (not shown), and patterning the above material layers, thereby forming such gate structure 306. The gate structures 306 stretch along a second direction 406 and straddle over the fin structures 304 and the STIs 302. The second direction 406 is preferably perpendicular to the first direction 404. The intersecting fin structures 304 and the gate structures 306 constitute a plurality of transistors 308. In one embodiment, the memory cell 400 is a SRAM region and comprises a plurality of memory cell regions 402. In detail, the memory cell region 400 is a 6-transistor (6 T) SRAM region and there are six transistors 308, two P-type transistors 308P and four N-type first transistors 308N to constitute one memory cell. Please see FIG. 8, which shows a schematic diagram of the equivalent circuit of the 6 T memory cell. As shown in FIG. 8, the transistors 308N are passage transistors (PG), the transistors 308N' are pull-down transistors (PL) and the transistors 308P are pull-up transistors (PU) in the memory cell region 402, thereby constitute one bit memory. However, the above description only shows one embodiment, and depending one different design, other arrangement of the cell memory cell is also available.

For detail descriptions for the transistors 308, please see the cross-sectional view of FIG. 1B. The transistor 308 is comprised of the gate structure 306, a spacer 316, a light doped drain (LDD) region 318 and a source/drain region 317. In one embodiment, the gate structure 306 comprises a capping layer 310, a conductive layer 312 and a gate dielectric layer 314. The capping layer 310 includes, for example, silicon nitride (SiN), silicon carbide (SiC) or silicon oxynitride (SiON). In one embodiment, the capping layer 310 may be one or multi layers composed of different dielectric materials. For example, the capping layer 310 may comprise a first capping layer (not shown) and a second capping layer (not shown), which is composed of $SiO_2$ and SiN, respectively. The conductive layer 312 can include poly-silicon or metal, such as Al, Ti, Ta, W, Nb, Mo, Cu, Ti, Tic, TaN, Ti/W, or Ti/TiN, or other composite metal material, and is not limited thereto. The gate dielectric layer 314 includes $SiO_2$ or high-k dielectric materials, such as a material having dielectric constant greater than 4. The high-k dielectric material may include rare earth metal oxide or lanthanide oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The spacer 316 is disposed on at least a sidewall of the gate structure 306. The spacer 316 can be a single layer or a composite layer, which is composed of high temperature oxide (HTO), silicon nitride, silicon oxide or silicon nitride (HCD-SiN) formed by hexachlorodisilane ($Si_2Cl_6$). The LDD region 318 is disposed in the fin structure 304 and has a predetermined conductive type dopant. In P-type transistor 308P, the predetermined conductivity type dopant is P type dopant, such as boron (B) and/or boron fluoride (BF). Conversely, in N-type transistor 308N, the predetermined conductivity type dopant an N-type dopant such as arsenic (As) and/or phosphorus (P) and/or antimony (Sb), but are not limited thereto. The source/drain region 317 is disposed in the fin structure 304 (or the substrate 300) at least one side of the gate structure 306 and has a dopant with the same conductive type with the LDD region 318. In one embodiment, the spacer 316 and the LDD region 318 are optional.

Subsequently, a first inter-dielectric (ILD) 319 is formed on the substrate 300 for covering the transistors 308. The ILD 319 may include $SiO_2$, silicon dioxide formed by precursor tetraethyl orthosilicate (TEOS), plasma enhanced silicon dioxide formed by precursor tetraethyl orthosilicate (PETEOS), but not limited thereto. Optionally, a metal gate replacement process can further be performed, including a chemical mechanism polish (CMP) process for removing the capping layer 310, removing the conductive layer 312 and/or the gate dielectric layer 314 for forming trenches (not shown), filling metal material and/or gate dielectric layer into the trench for forming a metal gate structure. In one embodiment, a second ILD layer 321 is formed on the first ILD layer 319. The second layer 321 can be made of different dielectric material from that of the first ILD layer 319. Alternatively, they can be formed of the same material.

Figure 2A:
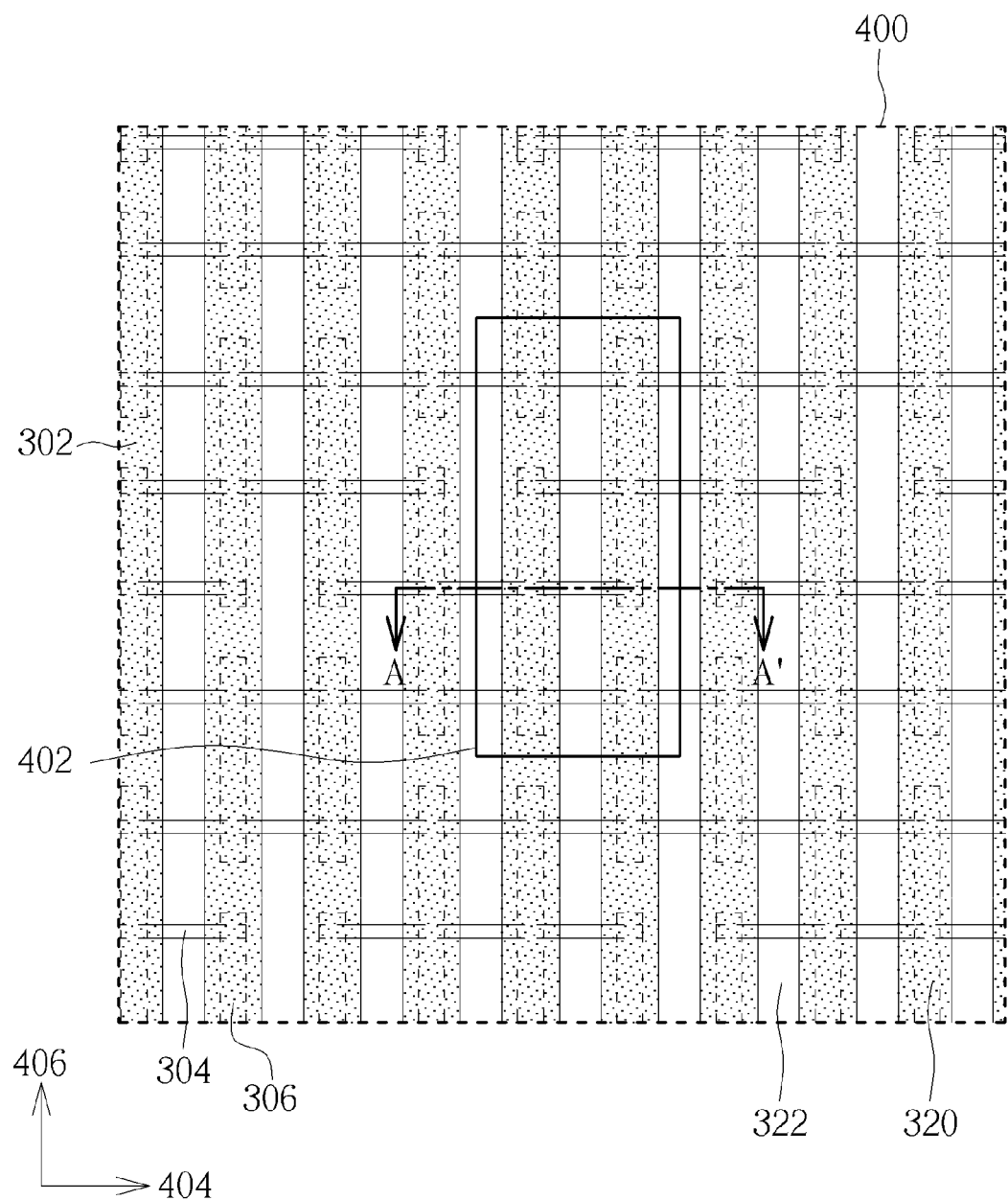
Figure 2B:
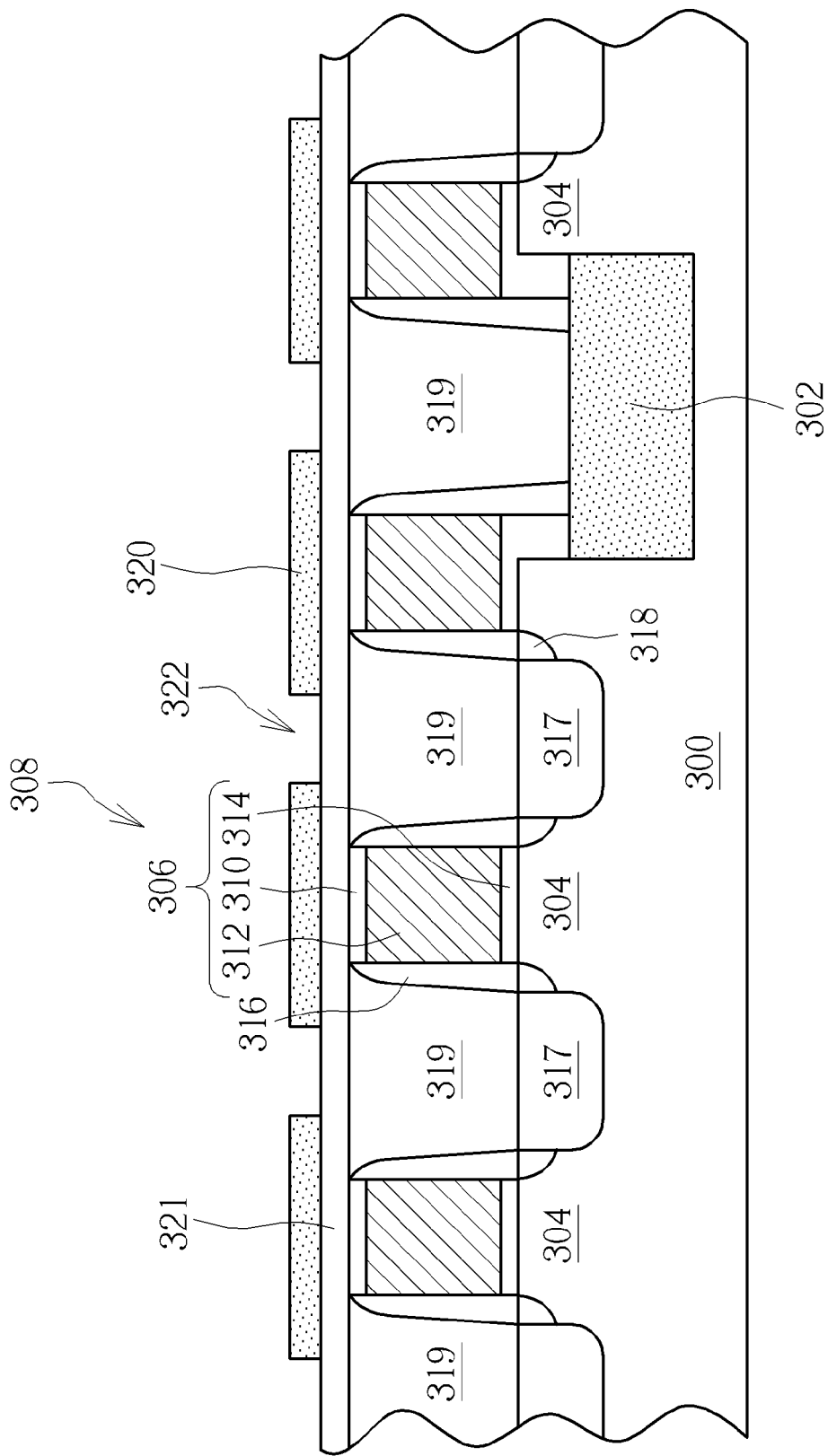

Next, as shown in FIG. 2A and FIG. 2B, a first patterned mask layer 320 is formed on the second ILD layer 321. In one embodiment, the first patterned mask layer 320 has an etching selectivity with respect to the first ILD layer 319 and the second ILD layer 321, and the material thereof can include titanium nitride (TiN), tantalum nitride (TaN), silicon nitride (SiN), silicon carbide (SiC) or silicon oxynitride (SiON), advanced pattern film (APF) supplied by the Applied Materials company, but is not limited thereto. The method for forming the first patterned mask layer 320 may include, for example, forming a first mask layer (not shown) comprehensively on the substrate 300, followed by forming a photoresist layer thereon. A photo-etching process (PEP) is carried out to form said first patterned mask layer 320 with first trenches 322. As shown in the top view of FIG. 2A, the first trenches 322 stretch along the second direction 406 and are arranged with the gate structures 306 alternatively. It is one salient feature that the first trenches 322 stretch along the whole memory region 400. With reference to FIG. 7, each first trench 322 stretches from the border 400A to the border 400C, meaning that each length (or width) of the first trench 300 is the same as the length (or width) of the memory region 400.

Figure 3A:
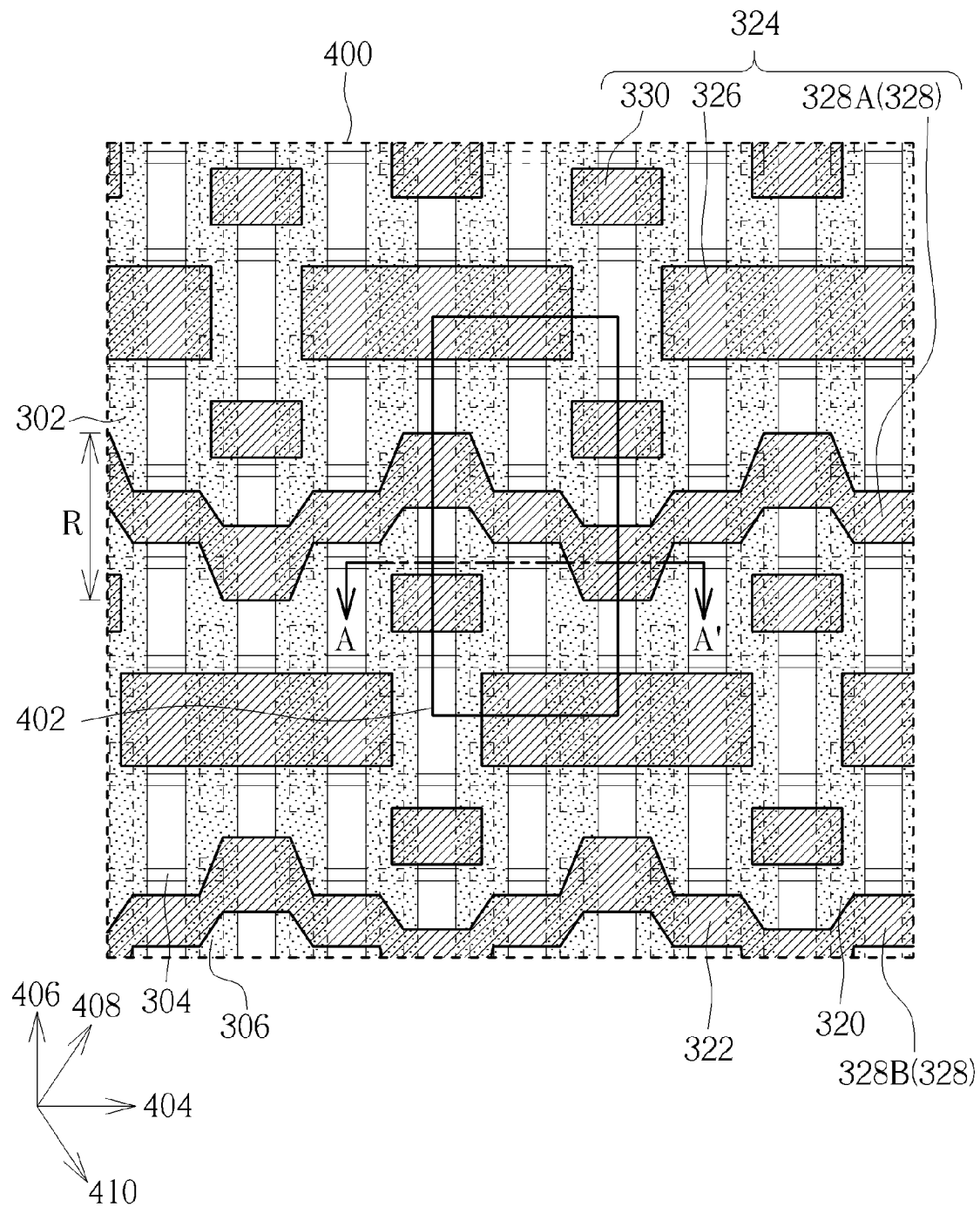
Figure 3B:
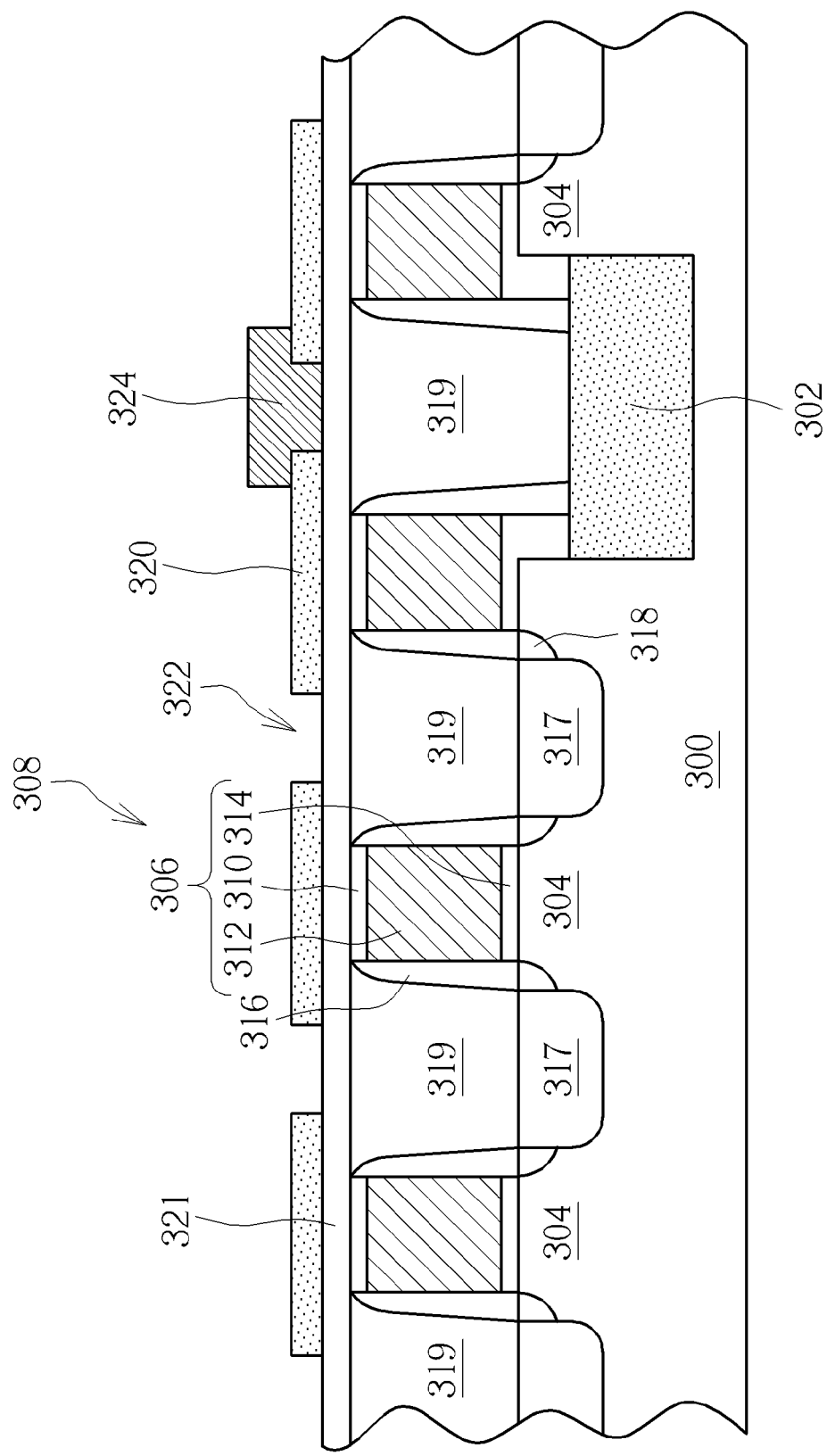

Next, as shown in FIG. 3A and FIG. 3B, a second patterned mask layer 324 is formed on the second ILD layer 321 and the first patterned mask layer 320. From the top view of FIG. 3A, the second patterned mask layer 324 includes a plurality of first patterns 326, a plurality of second patterns 328 and a plurality of third patterns 330. The first patterns 326 stretch along the first direction 404, and each first pattern 326 straddle over three first trenches 322; the second patterns 328 stretch along the first direction 404 in a serpent manner. In detail, the projection of the second patterns 328 along the second direction 404 is within a fixed range R. Further, the second pattern 328 (for example 328A) is symmetrically with the adjacent second pattern 328 (for example 328B). The second patterns 328 stretch along the whole memory region 400. As shown in FIG. 7, each second pattern 328 stretches from the border 400B to the border 400D, meaning that each length (or width) of the first trench 300 is the same as the length (or width) of the memory region 400. The third pattern 330 has a block shape and overlaps only one first trench 322. The third pattern 330 is disposed corresponding to the turning point of the serpent second pattern 326 and in the tapered region. In one memory cell region 402, there are portions of two first patterns 326, portions of one second pattern 328, and portions of two third patterns 330. As shown in FIG. 3B, the second patterned mask layer 324 only fill into a part of the first trench 322, while the other portion is not, thereby exposing under second ILD 321. The material of the second patterned mask layer 324 has an etching selectivity with respect to the first patterned mask layer 320 and the second ILD layer 321 and the first ILD layer 319, and can be selected from a group consisting of titanium nitride (TiN), tantalum nitride (TaN), silicon nitride (SiN), silicon carbide (SiC) or silicon oxynitride (SiON), advanced pattern film (APF), but is not limited thereto.

Figure 4A:
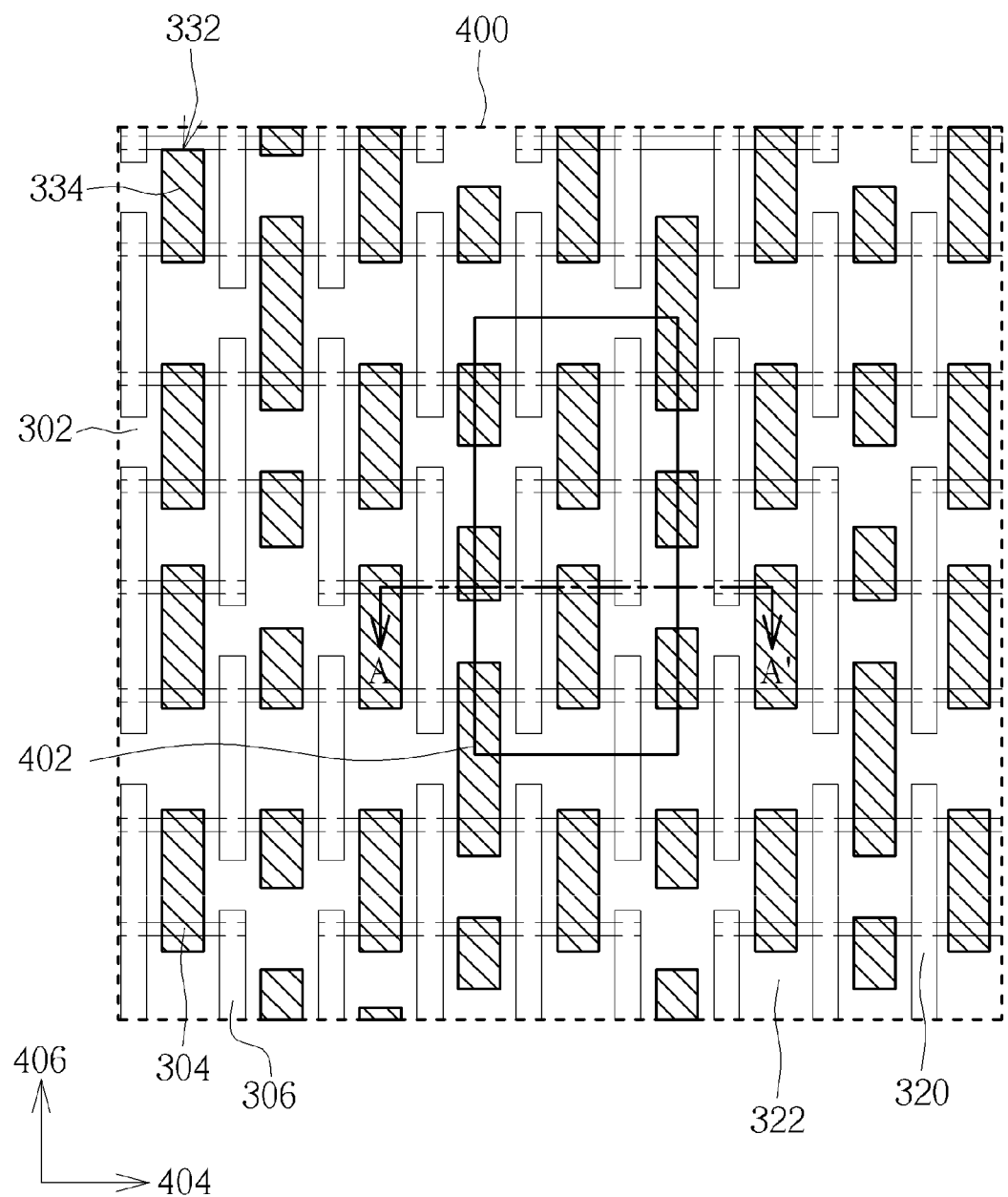
Figure 4B:
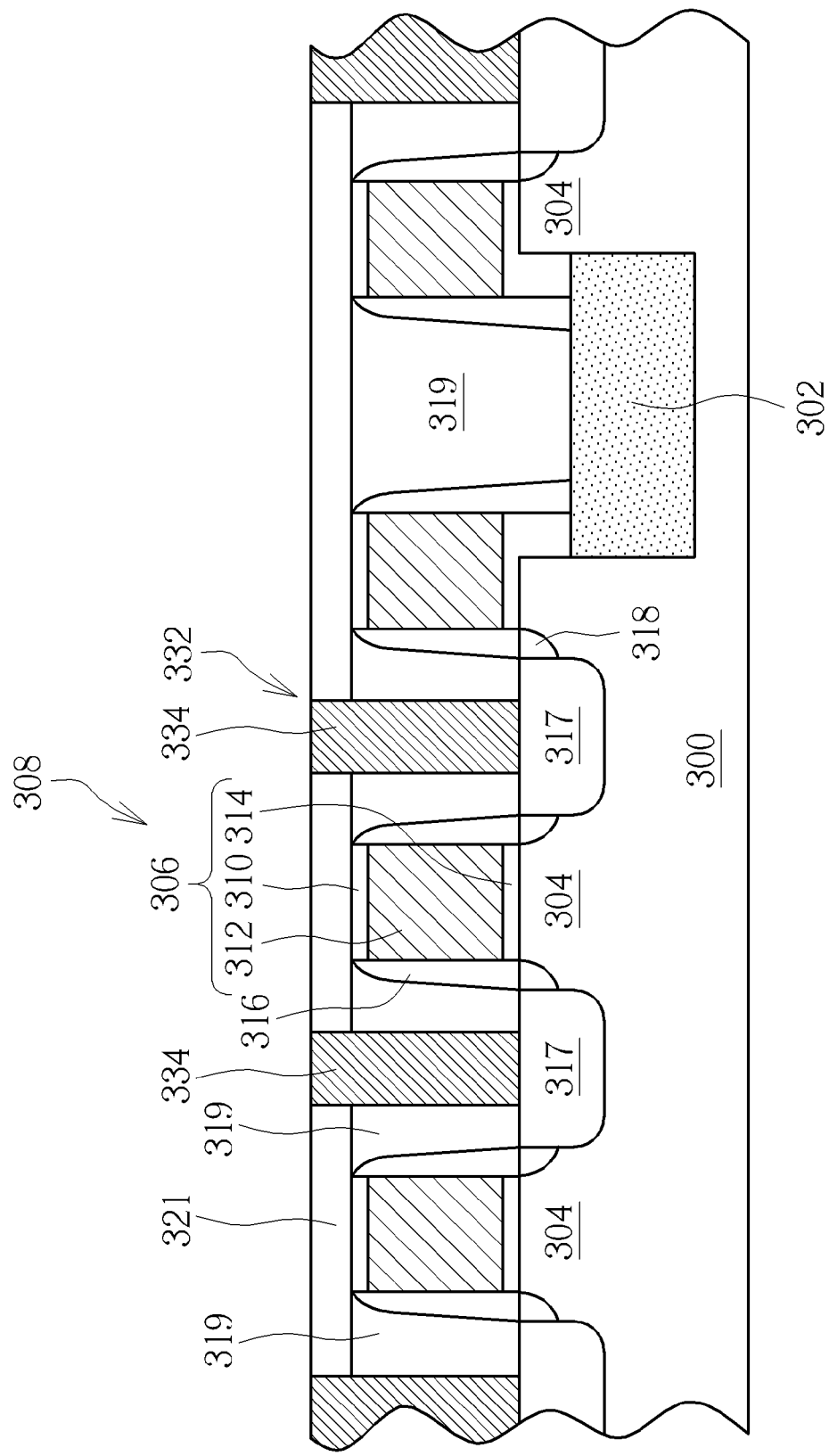

As shown in FIG. 4A and FIG. 4B, an etching process is carried out by using the first patterned mask layer 320 and the second patterned mask layer 324 as a mask to etch the second ILD layer 321 and the First ILD layer 319, thereby forming a plurality contact vias 332 in the second ILD layer 321 and the first ILD layer 319. The contact vias 332 would expose the source/drain 317 of the transistor 308. Next, one or more than one metal layer is then filled into the contact vias 332 to form a plurality of contact plugs 334. The material of each metal layer can include titanium (Ti), titanium nitride (TiN) tantalum nitride (TaN) aluminum (Al), titanium (Ti), tantalum (Ta), tungsten (W), niobium (Nb), molybdenum (Mo), copper (Cu), but is not limited thereto.

Thereafter, other semiconductor components can be formed in the following steps, such as forming another dielectric layer (not shown) on the second ILD layer 321 and forming via plugs (not shown) for electrically connecting the gate layer 312 of the gate structures 306. A metal interconnection system can be formed to electrically connect the contact plugs 334 and the via plugs for providing input/output signals for the transistor 308.

It is one salient feature in the present invention that the first trenches 322 of the first patterned mask layer 320 and the second patterns 328 of the second patterned mask layer 324 stretch through whole memory region 400. In comparison with conventional block pattern or stripe trench, the first trenches 322 and the second patterns 328 are easy to fabricate. In addition, the formed contact plugs 334 with rectangle shape can have relatively straight border.

Figure 5:
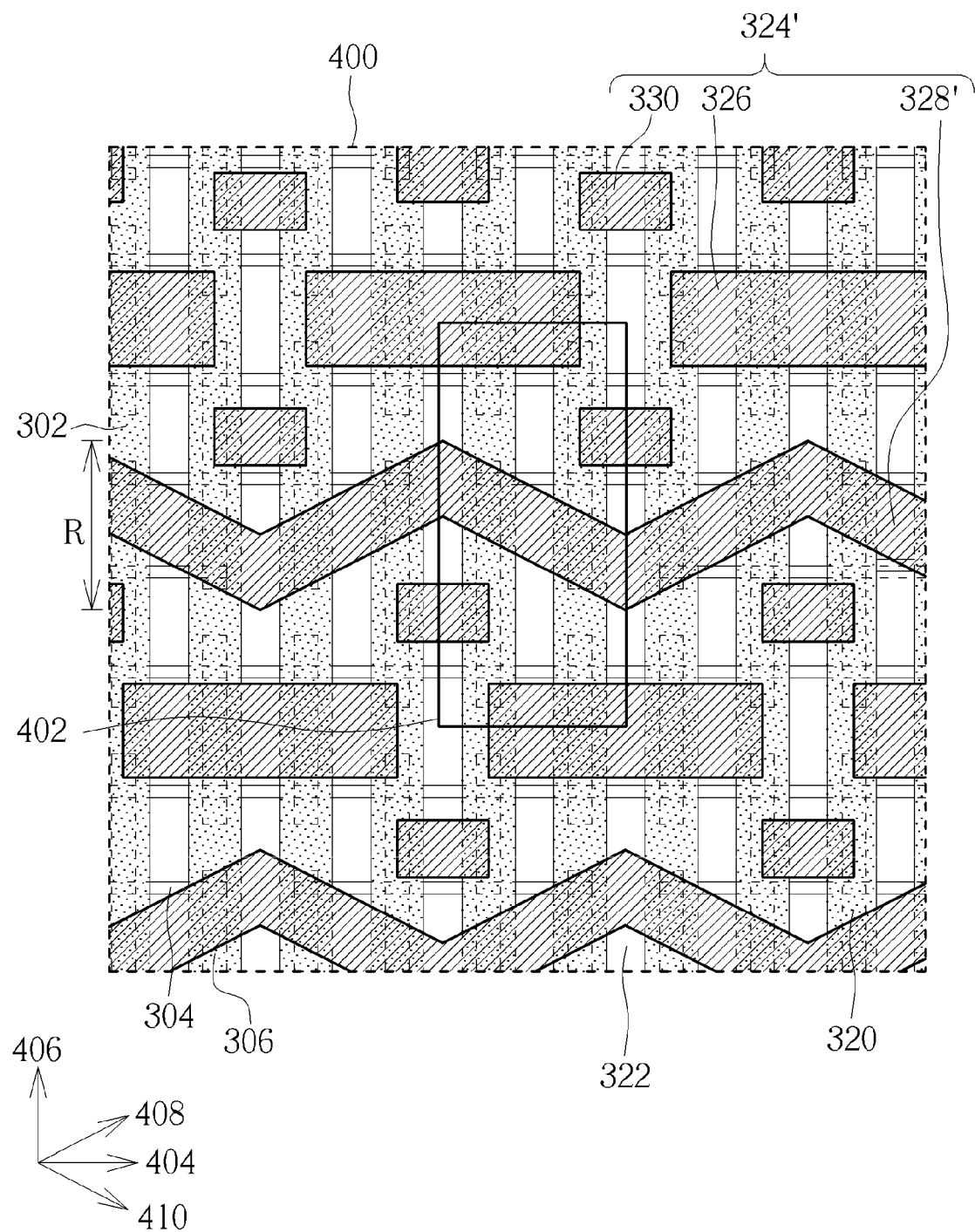
FIG. 5 and FIG. 6 are schematic diagrams according to another embodiment of the present invention.
Figure 6:
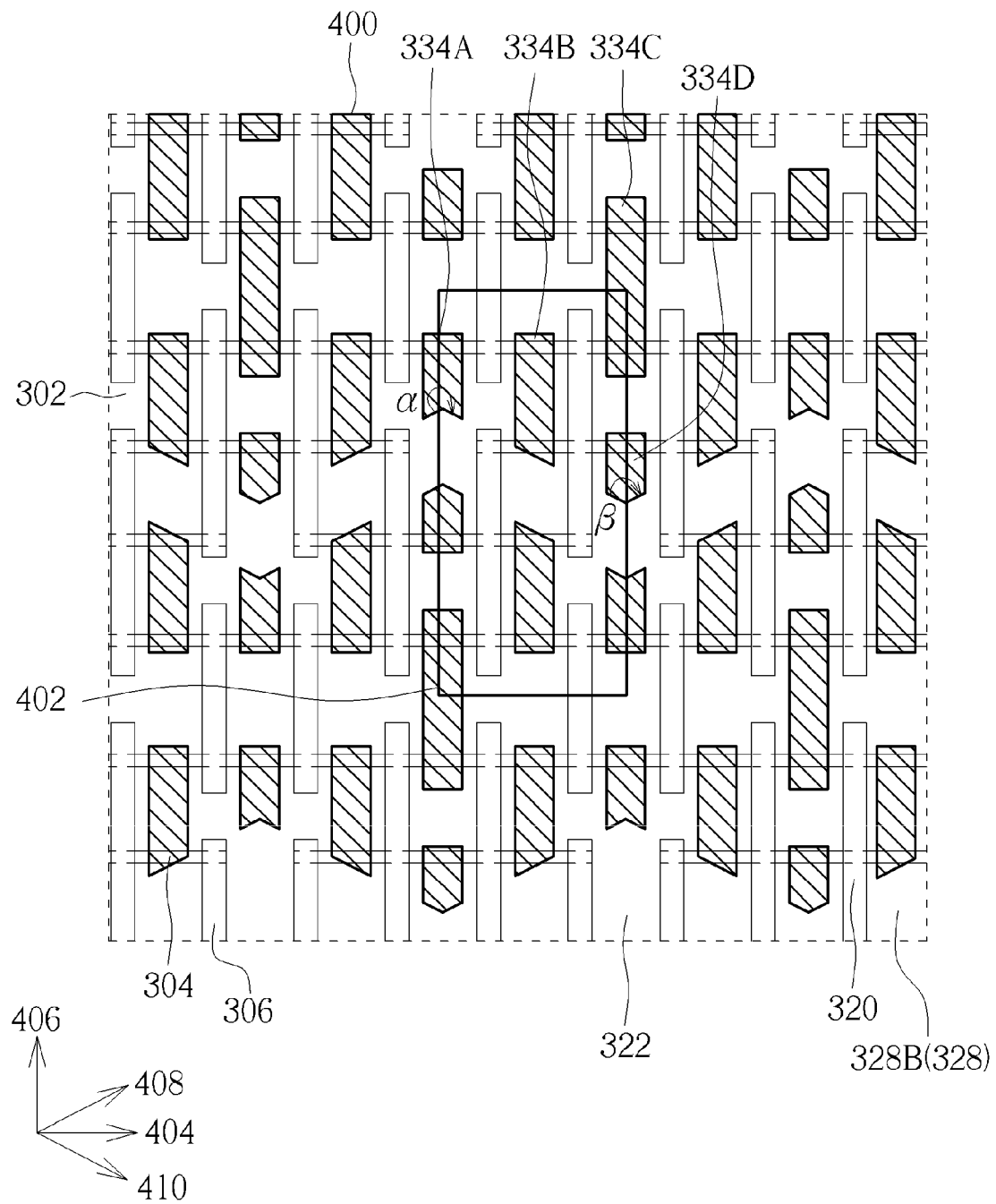

Please refer to FIG. 5 and FIG. 6, which show schematic diagrams of the second embodiment of the present invention. The former steps of the present embodiment are similar to the steps shown in FIG. 1A and FIG. 2A of the previous embodiments. After forming the first patterned mask layer 320 of FIG. 2A, as shown in FIG. 5, a second patterned mask layer 324' is formed. As shown in the first embodiment of FIG. 3A, the borders of the second pattern 328 that overlap the under first trench 322 would parallel to the first direction 404, while the borders of the second pattern 328 that does not overlap the first trench 322 would parallel to the serpent direction. In the present embodiment, the borders of the second patterns 328' would completely parallel to the serpent direction (the fourth direction 410 and the third direction 408), and a sharp angle is formed at the turning point. As such, as shown in the top view of FIG. 6, the formed contact plug 334 would have four types: the contact plugs 334A is a pentagon, and has a set of parallel side parallel to the second direction 406. The pentagon has an interior angle α smaller than 180 degrees; the contact plug 334 is a trapezoid and has only a set of side parallel to the second direction 404; the contact plug 334C is a rectangle; the contact plugs 334D is a pentagon, and has a set of parallel side parallel to the second direction 406; the pentagon of contact plug 334D has an interior angle β wherein α+β=180. It is understood that the above pattern can be changed in actual manufacturing process. For example, the angle or the border can have smooth shape but the shape should be within the scope of the present invention.

In summary, the present invention provides a semiconductor structure and the method of forming the same. Since the first patterned mask layer and the second patterned mask layer have patterns that are easy to form, the yields of the product can be upgraded. According to different embodiments, novel shapes of the contact plugs can also be provided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate having a memory region;
   a plurality of fin structures disposed in the memory region on the substrate, each fin structure stretches along a first direction;
   a plurality of gate structures disposed on the fin structures, each gate structure stretches along a second direction;
   a dielectric layer disposed on the fin structures and the gate structures; and
   a plurality of contact plugs disposed in the dielectric layer, each contact plug being electrically connected to a source/drain region of the fin structure, and the contact plug has a trapezoid shape or a pentagon shape from a top view, wherein one of the contact plugs has a pentagon shape from the top view and the pentagon has a set of side parallel to the second direction wherein the pentagon has an interior angle greater than 180 degrees.

2. The semiconductor structure according to claim 1, wherein the contact plug has a rectangle shape from the top view.

3. The semiconductor structure according to claim 1, wherein the contact plug has a trapezoid shape from the top view and the trapezoid has only a set of side parallel to the second direction.

4. The semiconductor structure according to claim 1, wherein one of the contact plugs has a pentagon shape from the top view and the pentagon has a set of side parallel to the second direction wherein the pentagon has an interior angle smaller than 180 degrees.

5. The semiconductor structure according to claim 1, wherein the memory region is a static random access memory (SRAM) region.

6. The semiconductor structure according to claim 5, wherein the SRAM memory region is a six transistor cell memory region.

* * * * *